United States Patent [19]

Imoto et al.

[11] Patent Number: 6,096,587
[45] Date of Patent: Aug. 1, 2000

[54] MANUFACTURING METHOD OF A JUNCTION FIELD EFFECT TRANSISTOR

[75] Inventors: Tsutomu Imoto; Yoshinori Ishiai; Mikio Kamada, all of Kanagawa, Japan

[73] Assignee: Sony Corporation, Tokyo, Japan

[21] Appl. No.: 09/398,764

[22] Filed: Sep. 17, 1999

[30] Foreign Application Priority Data

Sep. 25, 1998 [JP] Japan ................................. 10-271459

[51] Int. Cl.$^7$ ................................................. H01L 21/334
[52] U.S. Cl. .................... 438/191; 438/194; 438/285; 438/569; 438/572; 438/590
[58] Field of Search ................................. 438/194, 191, 438/285, 569, 572, 590, FOR 178, FOR 179, FOR 336

[56] References Cited

U.S. PATENT DOCUMENTS 4,738,934  4/1988  Johnston, Jr. et al. .
4,804,635  2/1989  Young .
5,242,846  9/1993  Izumi et al. .
5,597,744  1/1997  Kamiyama et al. .
5,872,031  2/1999  Mishra et al. .

*Primary Examiner*—George Fourson
*Assistant Examiner*—Joannie A. Garcia
*Attorney, Agent, or Firm*—Hill & Simpson

[57] ABSTRACT

A manufacturing method of a junction field effect transistor, promising a low ON resistance, high maximum drain current and linearity with a high transmission gain and also enabling the gate length to be reduced, makes a channel layer by sequentially epitaxially growing an undoped GaAs layer, $n^+$-type GaAs layer and n-type GaAs layer on a semi-insulating GaAs substrate via a GaAs buffer layer. Through an opening formed in a diffusion mask in form of a $SiN_x$ film on the n-type GaAs layer, Zn is diffused into the n-type GaAs layer to form a $p^+$-type gate region. From above the diffusion mask, a gate metal layer is deposited, and patterned to make a gate electrode in the opening of the diffusion mask in self-alignment with the $p^+$-type gate region.

18 Claims, 6 Drawing Sheets

MANUFACTURING METHOD OF A JUNCTION FIELD EFFECT TRANSISTOR

BACKGROUND OF THE INVENTION

1. Field of the Invention

This invention relates to a manufacturing method of a junction field effect transistor and, more particularly, to a manufacturing method of a junction field effect transistor suitable for use in amplification of a high-frequency signal.

2. Description of the Related Art

Mobile transmission terminals rapidly being popularized in recent years use waves of frequency bands as high as 800 MHz or 1.5 GHz, for example, for information transmission. As electronic parts for amplifying such high-frequency signals with low noise or with high efficiency, heretofore used are MESFET (metal semiconductor FET) using a III-V compound semiconductor, particularly GaAs, as its substrate, or MMIC (monolithic microwave IC) using the GaAs MESFET as its building block.

In GaAs MESFET, because of the advantages of its substrate material, namely, (1) electron mobility being high, (2) dielectric constant of the substrate being larger than that of $SiO_2$ by several times, (3) a substrate with a specific resistance as high as several $M\Omega cm$, and so on, a high transmission gain and a low noise factor could be obtained under a low source voltage even in those high frequency bands.

There are different types of GaAs MESFETs, depending on the method for making channel layers, namely, those made by ion-implanting an n-type impurity such as Si into a GaAs substrate (hereinafter abbreviated "ion-implanted MESFET") and those in which the channel layer is made by epitaxial growth (hereinafter abbreviated "epi-MESFET"). Central parts of cross-sectional structures of an ion-implanted MESFET and an epi-MESFET, as using semi-insulating GaAs substrates, are shown in FIG. 1 and FIG. 2, respectively.

In the ion-implanted MESFET shown in FIG. 1, after an n-type impurity and a p-type impurity are ion-implanted into a semi-insulating GaAs substrate 101, annealing is conducted for activating the impurities to thereby make an n-type channel layer 102 and a p-type buried layer 103 in the semi-insulating GaAs substrate 101. The p-type buried layer 103 functions to form a potential barrier against the majority carrier in the n-type channel layer and to suppress the substrate leak current caused by an electric field of the drain depletion layer. Subsequently, a source electrode 104 and a drain electrode 105 are made to get into ohmic contact with the n-type channel layer 102. Finally, a gate electrode 106 is made on a part of the n-type channel layer 102 between the source electrode 104 and the drain electrode 105 to form a Schottky junction 107. Thus, the basic structure of MESFET is completed. Numeral 108 denotes the depletion layer formed along the Schottky junction 107.

Usually, in addition to these steps of the process, some other steps are executed, for making a source region and a drain region by high-concentrated impurity implantation for the purpose of reducing ohmic contact resistance of the source electrode 104 and the drain electrode 105, and for etching the substrate surface in the gate region for the purpose of improving the resistance to voltage of the drain or controlling the threshold voltage (recess process). However, explanation thereof is omitted here.

On the other hand, in the epi-MESFET shown in FIG. 2, a barrier layer 202 and an n-type cannel layer 203 are sequentially epitaxially grown on a semi-insulating GaAs substrate 201. The barrier layer 202 corresponds to the p-type buried layer 103 in the ion-implanted MESFET shown in FIG. 1. In some cases, the barrier layer 202 is made of the same material as the n-type channel layer 203 similarly to the ion-implanted MESFET, and in other cases, it is made of a semiconductor material having a larger band gap than that of the n-type channel layer 203. After that, a source electrode 204 and a drain electrode 205 in ohmic contact with the n-type channel layer 203 are made. Finally, a gate electrode 206 is made on a part of the n-type channel layer 203 between the source electrode 204 and the drain electrode 205 to form a Schottky junction 207. Thus, the basic structure of MESFET is completed. Numeral 208 denotes the depletion layer formed along the Schottky junction 207.

Although the ion-implanted MESFET can be made at a lower cost than the epi-MESFET, the degree of freedom in designing the channel structure is small. This is because the concentration profile of the channel impurity is restricted by a certain distribution typical to the ion implantation.

On the other hand, in the epi-MESFET, relatively free channel impurity concentration profiles can be realized by controlling the flow rate of the doping source material gas upon epitaxial growth. Therefore, for making channel layers by epitaxial growth, there were used so-called low-high doping capable of making a retrograde concentration profile in which the impurity concentration progressively increases as getting deeper, or making a discontinuously changing impurity concentration, such as forming a low-concentrated layer on a high-concentrated layer, planar doping for making a very thin doping layer, and so on (for example, IEEE ED-25, p.600(1978)).

However, for making MMIC integrating RF switches, power amplifiers, etc. by using the above-introduced MESFET, two kinds of power sources, positive and negative, are usually required as its power source. This is presumably because a low ON resistance and an enough saturation drain current required in MMIC cannot be readily obtained with a positive power source alone.

On the other hand, Japanese Patent Laid-Open Publication No. hei 4-84440 discloses a technique for fabricating a $p^+$-type gate diffusion layer, i.e., a gate region, by sequentially epitaxially growing an n-type GaAs epitaxial layer as a channel layer and an $n^+$-type GaAs epitaxial layer as a source and a drain on a semi-insulating GaAs substrate via a buffer layer, then making a silicon nitride film as a diffusion mask thereon, and diffusing a p-type impurity like Zn or Mg, for example, into the n-type GaAs epitaxial layer through the $n^+$-type GaAs epitaxial layer. This technique, however, cannot make the gate electrode in self alignment with the gate diffusion layer because it makes the ohmic electrode for the gate diffusion layer, i.e., the gate electrode, after making the gate diffusion layer by using the diffusion mask, and then removing the diffusion mask. As a result, the width of the gate diffusion layer must be larger than the width of the gate electrode, and this means that the gate length cannot be made shorter than the alignment accuracy of lithography. That is, with this technique, decrease of the gate length and higher operation thereby cannot be expected.

OBJECTS AND SUMMARY OF THE INVENTION

It is therefore an object of the invention to provide a manufacturing method of a junction field effect transistor to obtain a low ON resistance, high maximum drain current and linearity with a transmission gain without the need for two kinds of power sources, positive and negative, and also enabling a decrease of the gate length.

According to the invention, there is provided a manufacturing method of a junction field effect transistor comprising the steps of:

epitaxially growing a channel layer on a substrate;

forming a diffusion mask on the channel layer;

forming a gate region by diffusing an impurity into the channel layer using the diffusion mask;

depositing a gate metal layer on the entire surface from above the diffusion mask; and patterning the gate metal layer to form a gate electrode.

In the present invention, the diffusion mask is typically an insulating film, particularly, a silicon nitride ($SiN_x$) film.

In the present invention, a barrier layer is provided, if necessary, between the substrate and the channel layer to reduce a leak current caused by a carrier flowing from the source electrode into the drain electrode through a portion of the channel layer where the gate electrode does not extend. The barrier layer is typically made of a semiconductor having a larger band gap than that of the channel layer, and preferably made of a semiconductor different in conduction type from the channel layer. In a typical example, the barrier layer includes a first high-resistance layer, electron supply layer overlying the first high-resistance layer, and second high-resistance layer overlying the electron supply layer. In this case, the channel layer typically contains two-dimensional electron gas made up of electrons supplied from the electron supply layer.

In a typical example of the present invention, the channel layer is made of GaAs, the gate region is a p-type region made by diffusing Zn into the channel layer, and the barrier layer includes at least an AlGaAs layer.

In the invention having the above-summarized structure, since the channel layer is an epitaxial layer and the gate structure is made up of the junction of the gate region and the channel layer formed by impurity diffusion, the invention can realize both a planar-doping or inverse HEMT (high electron mobility transistor) structure advantageous for improving the linearity of the transmission gain and a high gate barrier potential advantageous for decreasing the ON resistance and for improving the maximum drain current, and can therefore attain a linearity with a high transmission gain, low ON resistance and high maximum drain current. Additionally, since the gate electrode is in ohmic contact in self alignment with the gate region, the gate length can be decreased regardless of the alignment accuracy of lithography. Furthermore, by using Zn as the impurity for making the gate region, the substrate temperature is 600° C. at most during diffusion of Zn, and the loss of the impurity in the epitaxial layer and the steepness of the hetero interface can therefore be restricted within an allowable limit.

The above, and other, objects, features and advantage of the present invention will become readily apparent from the following detailed description thereof which is to be read in connection with the accompanying drawings.

DETAILED DESCRIPTION OF THE PREFERRED EMBODIMENTS

Some embodiments of the invention are explained below with reference to the drawings.

Figure 1:
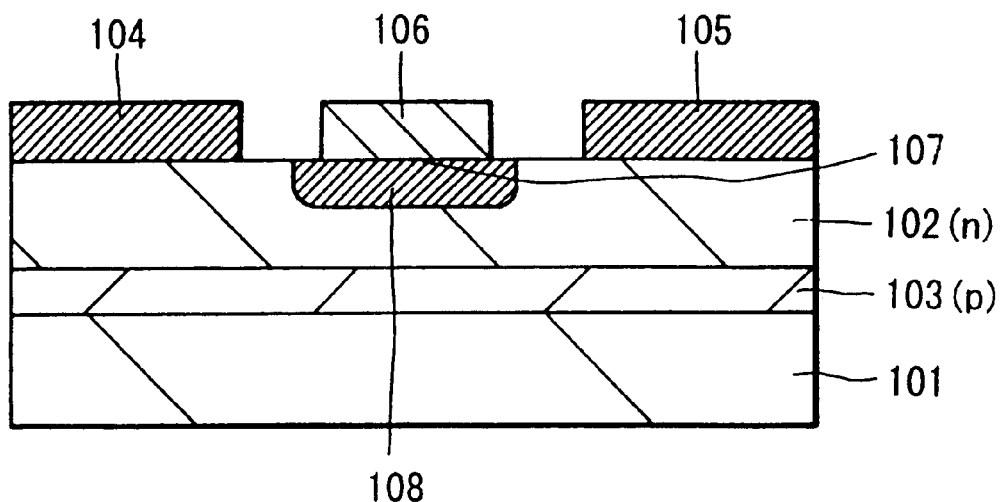
FIG. 1 is a cross-sectional view showing a conventional ion-implanted MESFET.
Figure 2:
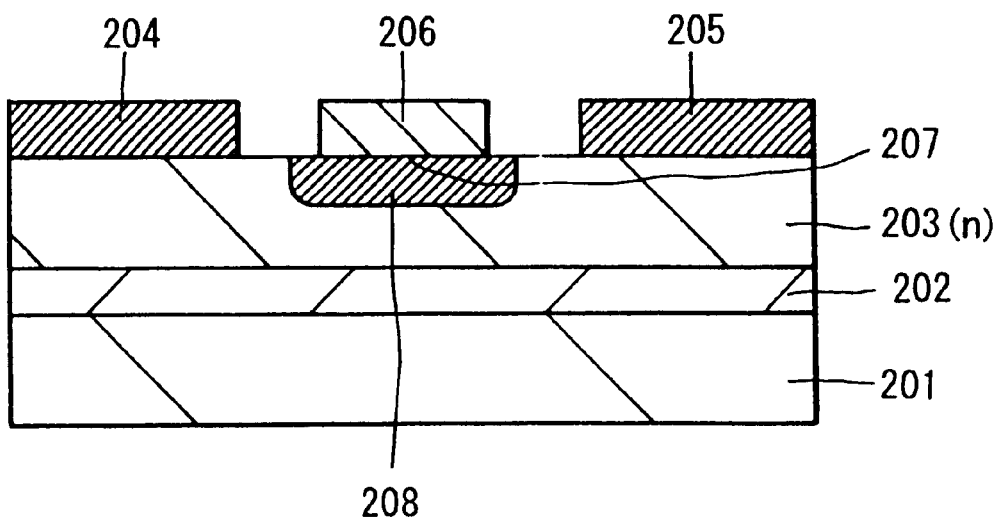
FIG. 2 is a cross-sectional view showing a conventional epi-MESFET.
Figure 3:
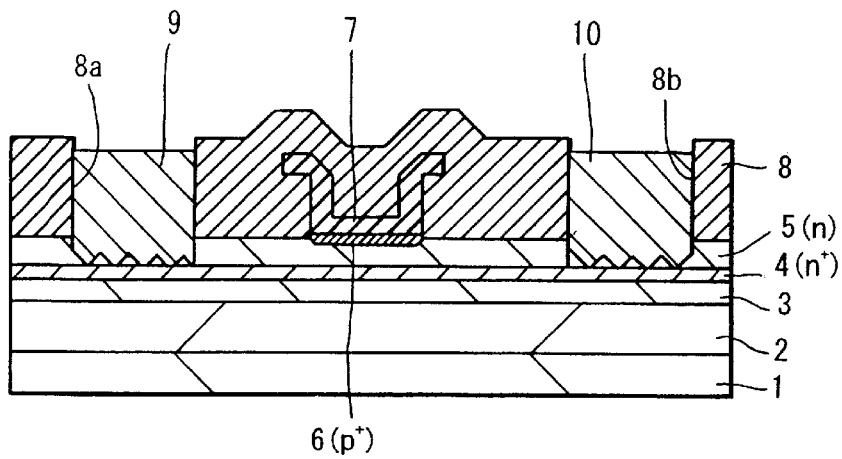
FIG. 3 is a cross-sectional view showing GaAs JFET according to the first embodiment of the invention.

FIG. 3 shows a GaAs junction FET (JFET) taken as the first embodiment of the invention. This GaAs JFET has a low-high-doped structure considered effective for improving the linearity of the transmission gain.

As shown in FIG. 3, in the GaAs JFET according to the first embodiment, an undoped GaAs layer 3, $n^+$-type GaAs layer 4 doped with an n-type impurity in a high concentration, and n-type GaAs layer 5 doped with an n-type impurity in a low concentration are sequentially grown on a semi-insulating GaAs substrate 1 via a GaAs buffer layer 2. These undoped GaAs layer 3, $n^+$-type GaAs layer 4 and n-type GaAs layer 5 made up a channel layer of a low-high-doped structure. The GaAs buffer layer 2 is 800 nm thick, for example. Impurity concentrations of the undoped GaAs layer 3, n+-type GaAs layer 4 and n-type GaAs layer 5 are determined taking account of the diffusion depth of a p+-type gate region, explained later, and the threshold voltage value $V_{TH}$ of the FET. For instance, when $V_{TH}$=-0.3V, the undoped GaAs layer 3 is 50 nm thick, n+-type GaAs layer 4 is 30 nm thick, n-type GaAs layer 5 is 120 nm thick, and impurity concentrations of these layers are $10^{15}$ cm$^{-3}$ or less of the undoped GaAs layer 3, $1\times10^{18}$ cm$^{-3}$ or less of the n+-type GaAs layer 4, and $1\times10^{17}$ cm$^{-3}$ of the n-type GaAs layer 5.

On the surface of a predetermined portion of the n-type GaAs layer 5, a diffusion layer of Zn as a p+-type gate region 6 is provided. A gate electrode 7 is in ohmic contact in self alignment with the p+-type gate region 6. The contact width of the gate electrode 7 is substantially the same as the width of the p+-type gate region 6. The gate electrode 7 may have a Ti/Pt/Au structure, for example, with thicknesses of Ti/Pt/Au=30 nm/50 nm/120 nm.

Provided on the n-type GaAs layer 5 is a SiN$_x$ film 8 which may be 270 to 420 nm thick, for example. The gate electrode 7 is buried in the SiN$_x$ film 8. The SiN$_x$ film 8 has openings 8a and 8b in predetermined portions. A source electrode 9 through the opening 8a and a drain electrode 10 through the opening 8b are in ohmic contact with the n-type GaAs layer 5. Contact portions of these source electrode 9 and drain electrode 10 with the n-type GaAs layer 5 are alloyed. Ohmic metals based on AuGe/Ni, for example, are used for making these source electrode 9 and drain electrode 10.

Next explained is a method for manufacturing the GaAs JFET having the above-explained structure according to the first embodiment. FIGS. 4 through 12 show this manufacturing method.

Figure 4:
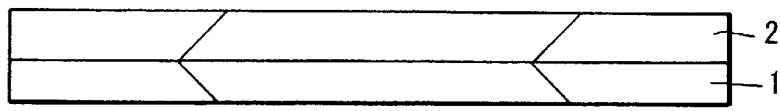
FIG. 4 is a cross-sectional view for explaining a manufacturing method of GaAs JFET according to the first embodiment of the invention.

For manufacturing the GaAs JFET according to the first embodiment, the GaAs buffer layer 2 is first epitaxially grown on the semi-insulating GaAs substrate 1 as shown in FIG. 4 FIG. 4. For epitaxial growth of the GaAs buffer layer 2, metal organic chemical vapor deposition (MOCVD) or molecular beam epitaxy (MBE) may be used.

Figure 5:
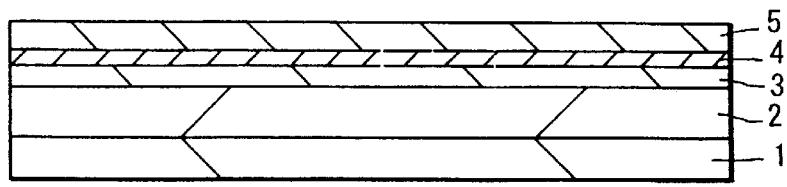
FIG. 5 a cross-sectional view for explaining the manufacturing method of GaAs JFET according to the first embodiment of the invention according to the first embodiment of the invention.

Next as shown in FIG. 5, epitaxially grown sequentially on the GaAs buffer layer 2 are the undoped GaAs layer 3, n+-type GaAs layer 4 and n-type GaAs layer 5. For epitaxial growth of these layers, MOCVD or MBE, for example, may be used.

Figure 6:
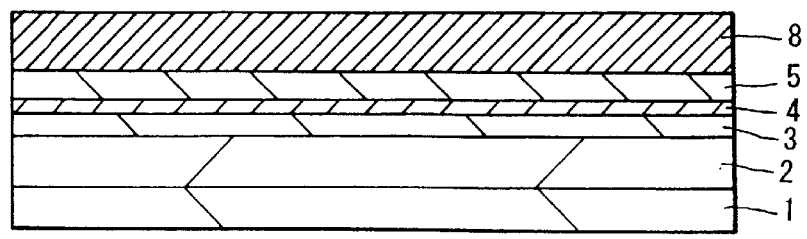
FIG. 6 is a cross-sectional view for explaining the manufacturing method of GaAs JFET according to the first embodiment of the invention.

Next as shown in FIG. 6, the SiN$_x$ film 8 is deposited on the n-type GaAs layer 5. The SiN$_x$ film 8 may be 150 through 300 nm thick, for example. For deposition of the SiN$_x$ film 8, plasma CVD may be used, for example.

Figure 7:
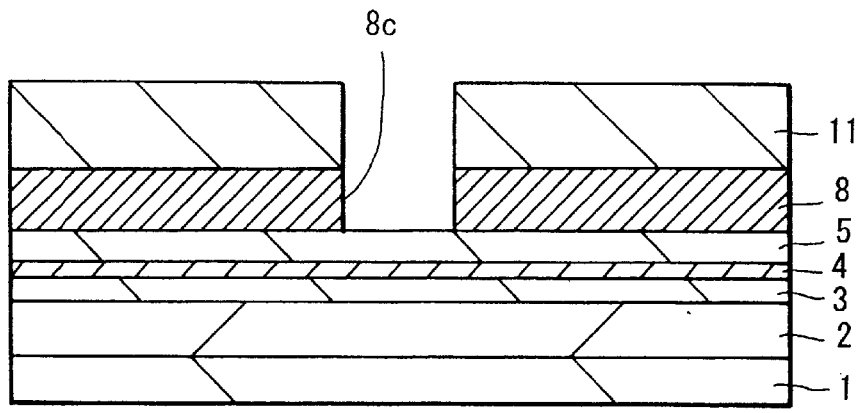
FIG. 7 is a cross-sectional view for explaining the manufacturing method of GaAs JFET according to the first embodiment of the invention.

Next as shown in FIG. 7, after a resist pattern 11 having an opening in a location for the gate portion is made on the SiN$_x$ film 8 by lithography, the SiN$_x$ film 8 is etched by using the resist pattern 11 as a mask to form a gate opening 8c. For this etching, reactive ion etching (RIE) using CF$_4$, for example, as the reaction gas may be employed.

Figure 8:
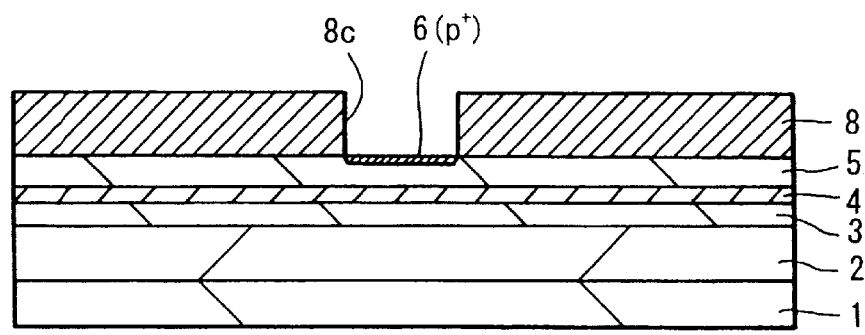
FIG. 8 is a cross-sectional view for explaining the manufacturing method of GaAs JFET according to the first embodiment of the invention.

After next removing the resist pattern 11, as shown in FIG. 8, the semi-insulating GaAs substrate 1 is heated to 600° C., for example, in a gas atmosphere containing diethylzinc (DEZ) and arsine (AsH$_3$), for example, to diffuse Zn in gas phase into the n-type GaAs layer 5 through the gate opening 8c and to thereby form the p+-type gate region 6.

Figure 9:
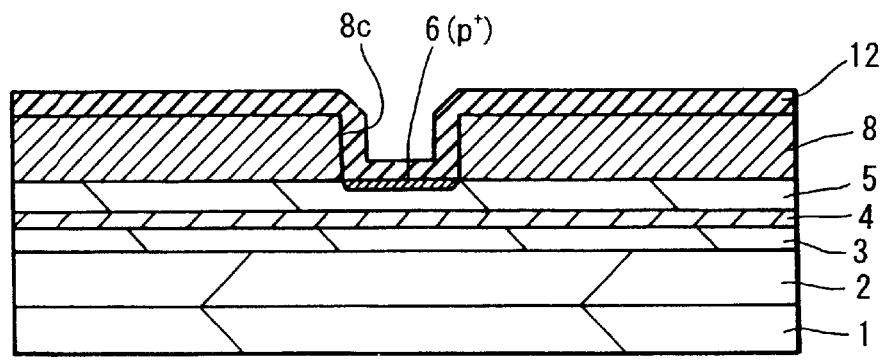
FIG. 9 is a cross-sectional view for explaining the manufacturing method of GaAs JFET according to the first embodiment of the invention.

Next as shown in FIG. 9, a gate metal layer 12 is deposited on the entire surface of the substrate. For deposition of the gate metal layer 12, electron beam evaporation, for example, may be employed.

Figure 10:
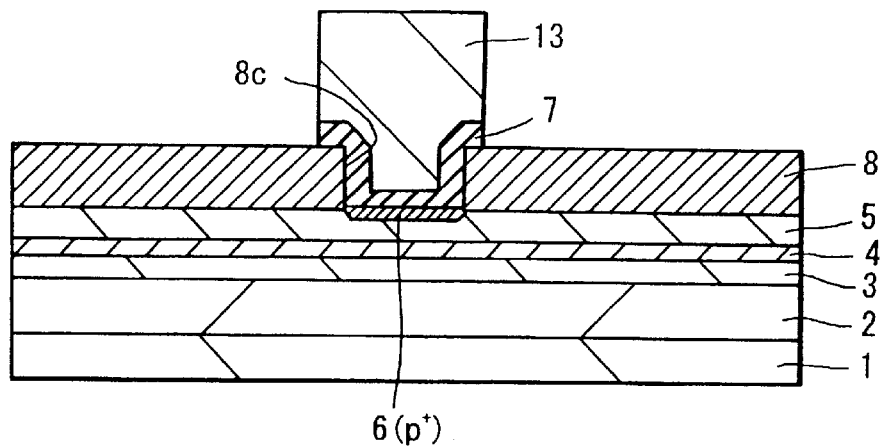
FIG. 10 is a cross-sectional view for explaining the manufacturing method of GaAs JFET according to the first embodiment of the invention.

Next as shown in FIG. 10, a resist pattern 13 corresponding in shape to the gate electrode is formed on the gate metal layer 12 by lithography. Using the resist pattern 13 as a mask, unnecessary portions of the gate metal 12 is next removed by etching to form the gate electrode 7. For this etching, ion milling using Ar gas, for example, may be employed.

Figure 11:
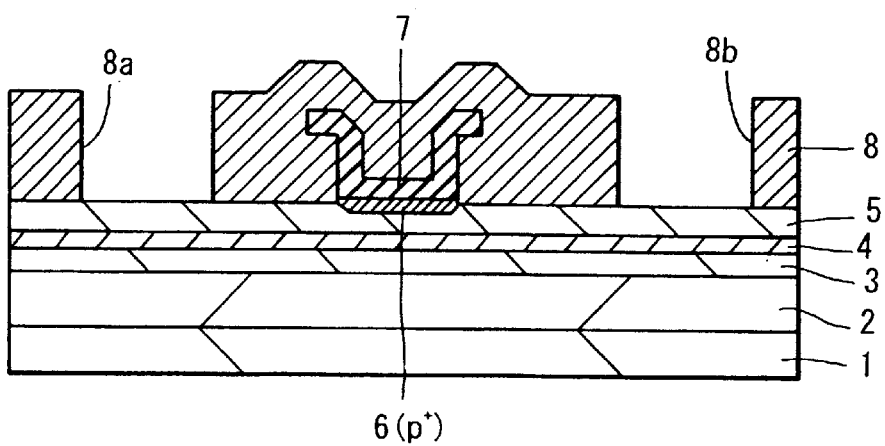
FIG. 11 is a cross-sectional view for explaining the manufacturing method of GaAs JFET according to the first embodiment of the invention.

Next as shown in FIG. 11, the SiN$_x$ film 8 is deposited on the entire substrate surface up to the thickness of 120 nm, for example, and a resist pattern (not shown) having an opening in locations for the ohmic electrodes is formed thereon by lithography. Using the resist pattern as a mask, the SiN$_x$ film 8 is etched to form the openings 8a and 8b and to thereby expose the surface of the n-type GaAs layer 5 in the locations for the ohmic electrodes.

Figure 12:
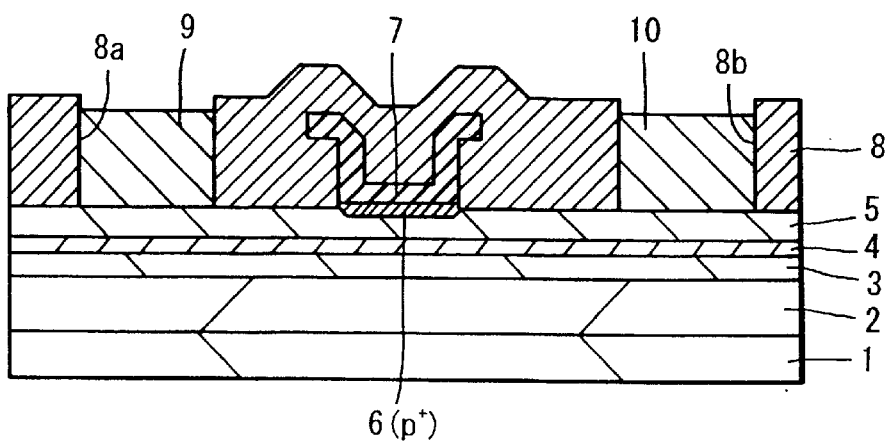
FIG. 12 is a cross-sectional view for explaining the manufacturing method of GaAs JFET according to the first embodiment of the invention.

Thereafter, maintaining the resist pattern used as the etching mask, a metal layer (not shown) for making ohmic electrodes is deposited on the entire substrate surface. For deposition of this metal layer, vacuum evaporation by resistance heating, for example, may be employed. As the metal layer, for example, after AuGe is first deposited by the thickness of 160 nm, Ni is deposited to the thickness of 400 nm. Thereafter, by lift-off, the resist pattern and the metal layer deposited thereon are removed altogether to remove unnecessary portions of the metal layer while maintaining the metal layer only inside the openings 8a and 8b of the SiN$_x$ film 8. As a result, as shown in FIG. 12, the source electrode 9 and the drain electrode 10 are formed inside the openings 8a and 8b, respectively.

After that, by annealing the semi-insulating GaAs substrate 1 in a predetermined forming gas, the source electrode 9 and the drain electrode 10 are alloyed with the underlying n-type GaAs layer 5 to get into ohmic contact therewith.

Through these steps, the intended GaAs JFET with a low-high-doped structure is completed.

For making a MMIC circuit, upper-layer wiring and LC passive elements are made successively.

As explained above, according to the first embodiment, since the channel layer is made up of an epitaxial layer and has a low-high-doped structure, the linearity of its transmission gain can be improved. Additionally, since the gate portion is made of the pn junction of the p+-type gate region 6 and the n-type GaAs layer 5, the height of the gate potential barrier can be increased, and therefore, a low ON resistance and a high maximum drain current can be obtained. Moreover, since the gate electrode 7 is made in self alignment with the p+-type gate region 6, the gate length can be decreased. Because of these advantages, the embodiment ensures realization of a GaAs JFET with low ON resistance, high maximum drain current and high linearity, and decreased in gate length. When using GaAs JFET to make MMIC, a high-performance MMIC can be obtained.

Figure 13:
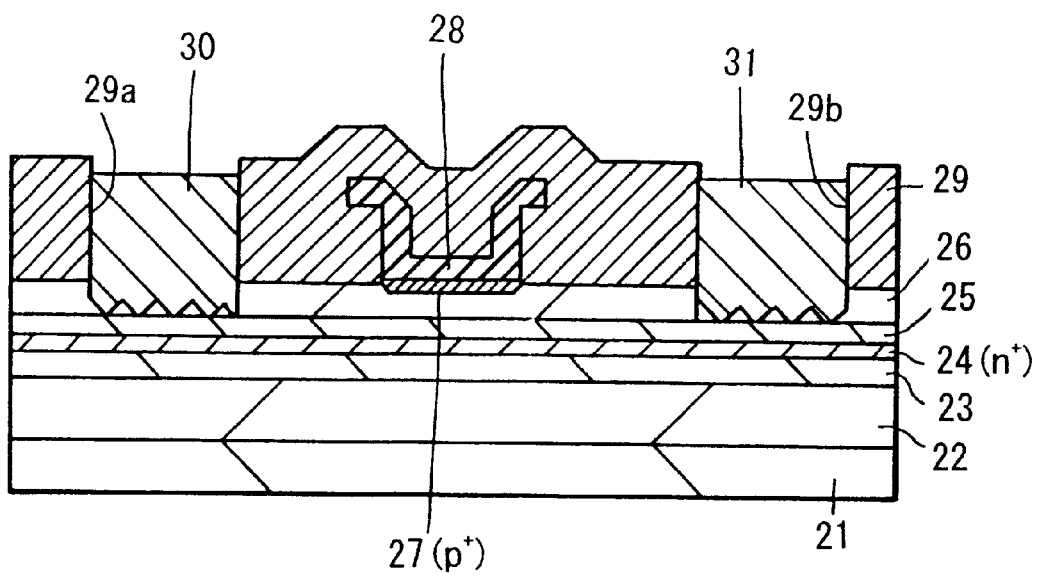
FIG. 13 is a cross-sectional view for explaining a manufacturing method of GaAs JFET according to the second embodiment of the invention.

Next explained is a GaAs JFET according to the second embodiment of the invention. The GaAs JFET shown here has an inverse HEMT structure advantageous for improving the linearity of the transmission gain. FIG. 13 shows this GaAs JFET.

As shown in FIG. 13, in the GaAs JFET according to the second embodiment, an undoped AlGaAs layer 23, n+-type AlGaAs electron supply layer 24 doped with an n-type impurity in a high concentration, undoped AlGaAs spacer layer 25 and undoped GaAs electron transporting layer 26 are sequentially grown on a semi-insulating GaAs substrate 21 via an undoped GaAs buffer layer 22. Although not shown, two-dimensional electron gas by electrons supplied from the n+-type AlGaAs electron supply layer 24 is formed in a part of the undoped GaAs electron transporting layer 26 along the boundary with the undoped AlGaAs spacer layer 25. This part of the undoped GaAs electron transporting layer 26 having formed the two-dimensional electron gas substantially exhibits an n-type. The undoped AlGaAs layer 23, n$^+$-type AlGaAs electron supply layer 24 and undoped AlGaAs spacer layer 25, as a whole, form a barrier layer. Thickness of the GaAs buffer layer 22 is 800 nm, for example. Thicknesses and impurity concentrations of the undoped AlGaAs layer 23, n$^+$-type AlGaAs electron supply layer 24, undoped AlGaAs spacer layer 25 and undoped GaAs electron transporting layer 26 are determined taking account of the diffusion depth of a p$^+$-type gate region, explained later, and the threshold voltage value $V_{TH}$ of the FET. For instance, when $V_{TH}$=−0.3V, the n$^+$-type AlGaAs electron supply layer 24 is 6 nm thick, the undoped AlGaAs spacer layer 25 is 2 nm thick, impurity concentration of the n$^+$-type AlGaAs electron supply layer 24 is 5×10$^{18}$ cm$^{-3}$ or less, and impurity concentration of the undoped AlGaAs spacer layer 25 is 1×10$^{15}$ cm$^{-3}$ or less. The undoped GaAs electron transporting layer 26 is preferably 150 nm, for example.

On the surface of a predetermined portion of the undoped GaAs electron transporting layer 26, a diffusion layer of Zn as a p$^+$-type gate region 27 is provided. A gate electrode 28 is in ohmic contact in self alignment with the p$^+$-type gate region 27. The contact width of the gate electrode 28 is substantially the same as the width of the p$^+$-type gate region 27. The gate electrode 28 may have a Ti/Pt/Au structure, for example, with thicknesses of Ti/Pt/Au=30 nm/50 nm/120 nm.

Provided on the undoped GaAs electron transporting layer 26 is a SiN$_x$ film 29 which may be 270 to 420 nm thick, for example. The gate electrode 28 is buried in the SiN$_x$ film 29. The SiN$_x$ film 29 has openings 29a and 29b in predetermined portions. A source electrode 30 through the opening 29a and a drain electrode 31 through the opening 29b are in ohmic contact with the two-dimensional electron gas formed in the undoped GaAs electron transporting layer 26. Contact portions of these source electrode 30 and drain electrode 31 with the undoped GaAs electron transporting layer 26 are alloyed. These source electrode 30 and drain electrode 31 are made by using ohmic metals based on AuGe/Ni, for example.

Next explained is a method for manufacturing the GaAs JFET having the above-explained structure according to the second embodiment.

Figure 14:
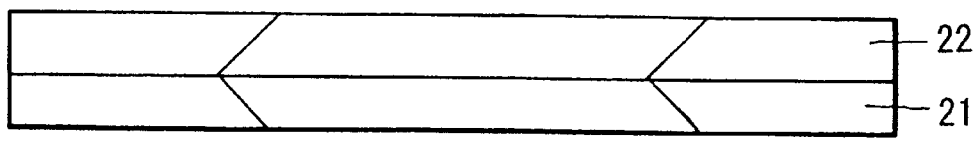
FIG. 14 is a cross-sectional view for explaining the manufacturing method of GaAs JFET according to the second embodiment of the invention.
Figure 15:
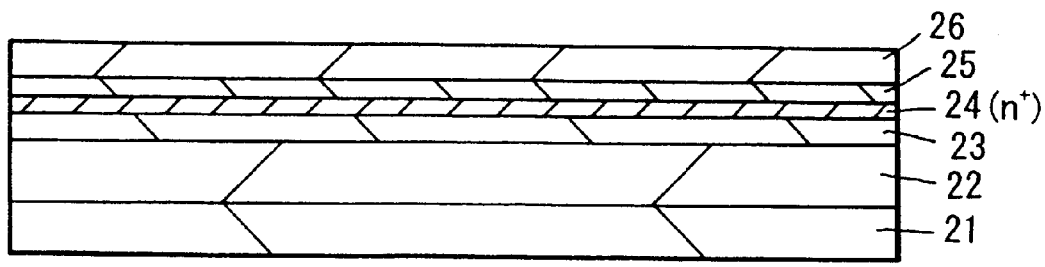
FIG. 15 is a cross-sectional view for explaining a manufacturing method of GaAs JFET according to the second embodiment of the invention.

For manufacturing the GaAs JFET according to the second embodiment, the GaAs buffer layer 22 is first epitaxially grown on the semi-insulating GaAs substrate 21 as shown in FIG. 14. Next as shown in FIG. 15, epitaxially grown sequentially on the GaAs buffer layer 22 are the undoped AlGaAs layer 23, n$^+$-type AlGaAs electron supply layer 24, undoped AlGaAs spacer layer 25 and undoped GaAs electron transporting layer 26. For epitaxial growth of these layers, MOCVD or MBE, for example, may be used.

After that, in the same manner as the first embodiment, progressing the step of making the p$^+$-type gate region 27 and subsequent steps, the intended GaAs JFET with an inverse HEMT structure is completed.

As explained above, according to the second embodiment, since the undoped GaAs electron transporting layer 26 as the channel layer is made up of an epitaxial layer and has an inverse HEMT structure, the linearity of its transmission gain can be improved. Additionally, since the gate portion is made of the pn junction of the p$^+$-type gate region 27 and the undoped GaAs electron transporting layer 26 containing the two-dimensional electron gas, the height of the gate potential barrier can be increased, and therefore, a low ON resistance and a high maximum drain current can be obtained. Moreover, since the gate electrode 28 is made in self alignment with the p$^+$-type gate region 27, the gate length can be decreased. Because of these advantages, the embodiment ensures realization of a GaAs JFET with low ON resistance, high maximum drain current and high linearity, and decreased in gate length. When using GaAs JFET to make MMIC, a high-performance MMIC can be obtained.

Figure 16:
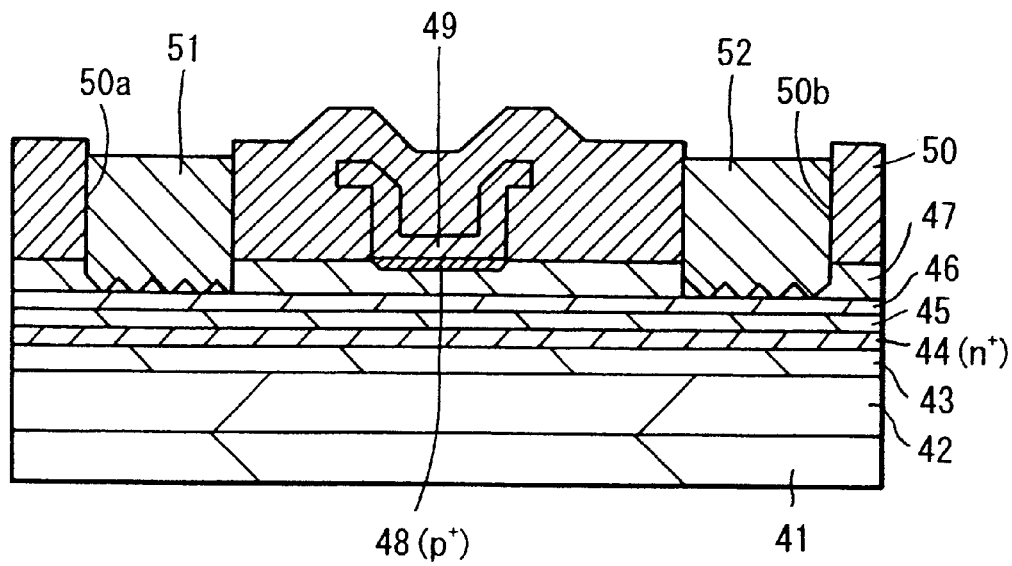
FIG. 16 is a cross-sectional view for explaining a manufacturing method of GaAs JFET according to the third embodiment of the invention.

Next explained is a GaAs JFET according to the third embodiment of the invention. This GaAs JFET, like the GaAs JFET according to the second embodiment, has an inverse HEMT structure advantageous for improving the linearity of the transmission gain. FIG. 16 shows this GaAs JFET.

As shown in FIG. 16, in the GaAs JFET according to the third embodiment, an undoped AlGaAs layer 43, n$^+$-type AlGaAs electron supply layer 44 doped with an n-type impurity in a high concentration, undoped AlGaAs spacer layer 45, undoped InGaAs electron transporting layer 46 and undoped GaAs electron transporting layer 47 are sequentially grown on a semi-insulating GaAs substrate 41 via an undoped GaAs buffer layer 42. Although not shown, two-dimensional electron gas by electrons supplied from the n$^+$-type AlGaAs electron supply layer 44 is formed in a part of the undoped InGaAs electron transporting layer 46 and the undoped GaAs electron transporting layer 47 near the boundary with the undoped AlGaAs spacer layer 45. This part of the undoped InGaAs electron transporting layer 46 and the undoped GaAs electron transporting layer 47 having formed the two-dimensional electron gas substantially exhibits an n-type. The undoped AlGaAs layer 43, n$^+$-type AlGaAs electron supply layer 44 and undoped AlGaAs spacer layer 45, as a whole, form a barrier layer. Thickness of the GaAs buffer layer 42 is 800 nm, for example. Thicknesses and impurity concentrations of the undoped AlGaAs layer 43, n$^+$-type AlGaAs electron supply layer 44, undoped AlGaAs spacer layer 45, undoped InGaAs electron transporting layer 46 and undoped GaAs electron transporting layer 47 are determined taking account of the diffusion depth of a p$^+$-type gate region, explained later, and the threshold voltage value $V_{TH}$ of the FET. For instance, when $V_{TH}$=−0.3V, the n$^+$-type AlGaAs electron supply layer 44 is 6 nm thick, the undoped AlGaAs spacer layer 45 is 2 nm thick, impurity concentration of the n$^+$-type AlGaAs electron supply layer 44 is 5×10$^{18}$ cm$^{-3}$ or less, and impurity concentration of the undoped AlGaAs spacer layer 45 is 1×10$^{15}$ cm$^{-3}$ or less. The undoped InGaAs electron transporting layer 46 is 15 nm, taking the variable width of the two-dimensional electron gas into consideration, and the undoped GaAs electron transporting layer 47 is 134 nm thick.

On the surface of a predetermined portion of the undoped GaAs electron transporting layer 47, a diffusion layer of Zn as a p$^+$-type gate region 48 is provided. A gate electrode 49 is in ohmic contact in self alignment with the p$^+$-type gate region 49. The contact width of the gate electrode 49 is substantially the same as the width of the p$^+$-type gate region 48. The gate electrode 49 may have a Ti/Pt/Au structure, for example, with thicknesses of Ti/Pt/Au=30 nm/50 nm/120 nm.

Provided on the undoped GaAs electron transporting layer 47 is a SiN$_x$ film 50 which may be 270 to 420 nm thick, for example. The gate electrode 49 is buried in the SiN$_x$ film 50. The SiN$_x$ film 50 has openings 50a and 50b in predetermined portions. A source electrode 51 through the opening 50a and a drain electrode 52 through the opening 50b are in ohmic contact with the two-dimensional electron gas formed in the undoped GaAs electron transporting layer 47 and the undoped InGaAs electron transporting layer 46. Contact portions of these source electrode 51 and drain electrode 52 with the undoped GaAs electron transporting layer 47 are alloyed. These source electrode 51 and drain electrode 52 are made by using ohmic metals based on AuGe/Ni, for example.

Next explained is a method for manufacturing the GaAs JFET having the above-explained structure according to the third embodiment.

Figure 17:
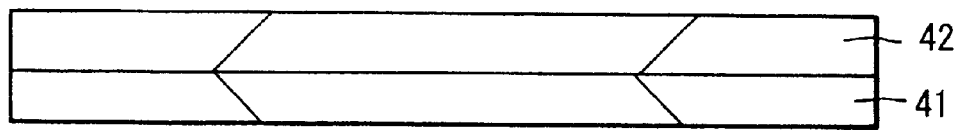
FIG. 17 is a cross-sectional view for explaining the manufacturing method of GaAs JFET according to the third embodiment of the invention.
Figure 18:
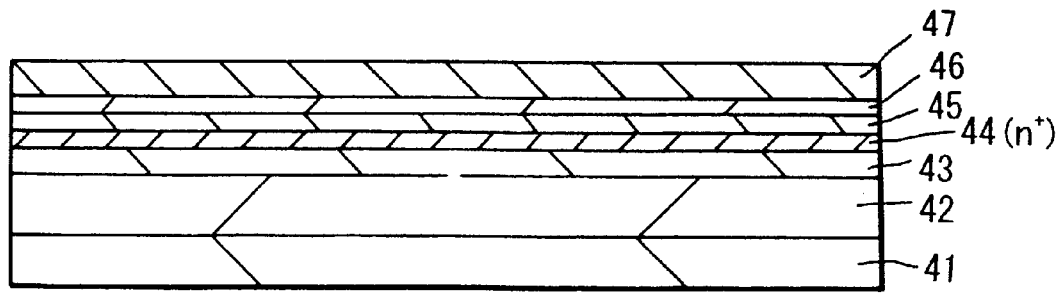
FIG. 18 is a cross-sectional view for explaining the manufacturing method of GaAs JFET according to the third embodiment of the invention.

For manufacturing the GaAs JFET according to the third embodiment, the GaAs buffer layer 42 is first epitaxially grown on the semi-insulating GaAs substrate 41 as shown in FIG. 17. Next as shown in FIG. 18, epitaxially grown sequentially on the GaAs buffer layer 42 are the undoped AlGaAs layer 43, $n^+$-type AlGaAs electron supply layer 44, undoped AlGaAs spacer layer 45, undoped InGaAs electron transporting layer 46 and undoped GaAs electron transporting layer 47. For epitaxial growth of these layers, MOCVD or MBE, for example, may be used.

After that, in the same manner as the first embodiment, progressing the step of making the $p^+$-type gate region 48 and subsequent steps, the intended GaAs JFET with an inverse HEMT structure is completed.

As explained above, according to the third embodiment, since the undoped InGaAs electron transporting layer 46 and the undoped GaAs electron transporting layer 47 as the channel layer are made up of epitaxial layers and form an inverse HEMT structure, the linearity of its transmission gain can be improved. Additionally, since the gate portion is made of the pn junction of the $p^+$-type gate region 27 with the undoped InGaAs electron transporting layer 46 and the undoped GaAs electron transporting layer 47 containing the two-dimensional electron gas, the height of the gate potential barrier can be increased, and therefore, a low ON resistance and a high maximum drain current can be obtained. In this case, since the electron mobility in the undoped InGaAs electron transporting layer 46 forming the channel layer is very high, the ON resistance is especially reduced significantly. Moreover, since the gate electrode 49 is made in self alignment with the $p^+$-type gate region 48, the gate length can be decreased. Because of these advantages, the embodiment ensures realization of a GaAs JFET with low ON resistance, high maximum drain current and high linearity, and decreased in gate length. When using GaAs JFET to make MMIC, a high-performance MMIC can be obtained.

Having described specific preferred embodiments of the present invention with reference to the accompanying drawings, it is to be understood that the invention is not limited to those precise embodiments, and that various changes and modifications may be effected therein by one skilled in the art without departing from the scope or the spirit of the invention as defined in the appended claims.

For example, numerical values, processes, materials and structures shown in the first, second and third embodiments are not but examples, and any other appropriate numerical values, processes, materials and structures may be used.

More specifically, in the GaAs JFET according to the first embodiment, for example, a barrier layer of AlGaAs, for example, may be provided between the channel layer and the GaAs buffer layer 2.

As described above, according to the invention, because of making the channel layer as an epitaxial layer, establishing the gate structure utilizing the junction the gate region made by impurity diffusion with the channel layer, and making the gate electrode in self alignment with the gate region, a low ON resistance, high maximum drain current and linearity with a high transmission gain can be realized, and the gate length can be reduced as well.

What is claimed is:

1. A manufacturing method of a junction field effect transistor comprising the steps of:
   epitaxially growing a channel layer on a substrate;
   forming a diffusion mask on said channel layer;
   forming a gate region by diffusing an impurity into said channel layer using said diffusion mask;
   depositing a gate metal layer on the entire surface from above said diffusion mask; and
   patterning said gate metal layer to form a gate electrode.

2. The manufacturing method according to claim 1 wherein said diffusion mask is an insulating film.

3. The manufacturing method according to claim 1 wherein a barrier layer is epitaxially grown on said substrate, and said channel layer is epitaxially grown on said barrier layer.

4. The manufacturing method according to claim 3 wherein said barrier layer is made of semiconductor larger in band gap than said channel layer.

5. The manufacturing method according to claim 3 wherein said barrier layer includes a first high-resistance layer, an electron supply layer overlying said first high-resistance layer and lower in resistance value than said first high-resistance layer, and a second high-resistance layer overlying said electron supply layer and higher in resistance value than said electron supply layer.

6. The manufacturing method according to claim 5 wherein said channel layer contains two-dimensional electron gas made by electrons supplied from said electron supply layer.

7. The manufacturing method according to claim 1 wherein said channel layer is made of GaAs, and said gate region is a p-type region made by diffusing Zn into said channel layer.

8. The manufacturing method according to claim 1 wherein a barrier layer including at least an AlGaAs layer is epitaxially grown on said substrate, and said channel layer is epitaxially grown on said barrier layer.

9. The manufacturing method according to claim 1 further comprising the steps of:
   forming an insulating film covering said gate electrode;
   making openings in said insulating film; and
   forming a source electrode and a drain electrode in said openings.

10. A manufacturing method of a junction field effect transistor comprising the steps of:
    epitaxially growing a channel layer on a semi-insulating substrate;
    thereafter making an insulating diffusion mask on said channel layer;
    diffusing an impurity into said channel layer by using said diffusion mask to form a gate region;
    thereafter depositing a gate metal layer on the entire surface from above said diffusion mask; and
    patterning said gate metal layer to form a gate electrode.

11. The manufacturing method according to claim 10 wherein said diffusion mask is an insulating film.

12. The manufacturing method according to claim 10 wherein a barrier layer is epitaxially grown on said semi-insulating substrate, and said channel layer is epitaxially grown on said barrier layer.

13. The manufacturing method according to claim 12 wherein said barrier layer is made of semiconductor larger in band gap than said channel layer.

14. The manufacturing method according to claim 12 wherein said barrier layer includes a first high-resistance layer, an electron supply layer overlying said first high-resistance layer and lower in resistance value than said first high-resistance layer, and a second high-resistance layer overlying said electron supply layer and higher in resistance value than said electron supply layer.

15. The manufacturing method according to claim 14 wherein said channel layer contains two-dimensional electron gas made by electrons supplied from said electron supply layer.

16. The manufacturing method according to claim 10 wherein said channel layer is made of GaAs, and said gate region is a p-type region made by diffusing Zn into said-channel layer.

17. The manufacturing method according to claim 10 wherein a barrier layer including at least an AlGaAs layer is epitaxially grown on said substrate, and said channel layer is epitaxially grown on said barrier layer.

18. The manufacturing method according to claim 10 further comprising the steps of:

forming an insulating film covering said gate electrode;

making openings in said insulating film; and forming a source electrode and a drain electrode in said openings.

* * * * *